United States Patent [19]

Chartier

[11] Patent Number: 4,464,723
[45] Date of Patent: Aug. 7, 1984

[54] DIGITAL GAIN CONTROL SYSTEM

[75] Inventor: Michael S. Chartier, East Brunswick, N.J.

[73] Assignee: RCA Corporation, New York, N.Y.

[21] Appl. No.: 336,170

[22] Filed: Dec. 31, 1981

[51] Int. Cl.³ .............................................. H03G 3/00
[52] U.S. Cl. .................................. 364/571; 328/168; 358/174; 307/264; 375/98
[58] Field of Search ............................ 364/480, 571; 340/347 CC, ; 330/129, 278, 279; 307/264; 328/168; 381/104; 455/247, 234, 251; 375/98, 11, 12; 358/160, 174

[56] References Cited

U.S. PATENT DOCUMENTS

| | | | |
|---|---|---|---|
| 3,970,954 | 7/1976 | Even | 331/53 |
| 4,213,097 | 7/1980 | Chiu et al. | 330/129 |
| 4,270,177 | 5/1981 | Endoh et al. | 364/571 |
| 4,274,107 | 6/1981 | Tamura et al. | 328/168 |
| 4,356,731 | 11/1982 | Mahony | 364/571 |
| 4,396,938 | 8/1983 | Dischert | 358/160 |
| 4,409,682 | 10/1983 | Mori et al. | 381/104 |
| 4,412,182 | 10/1983 | Yochum | 330/129 |

Primary Examiner—Gary Chin
Attorney, Agent, or Firm—E. M. Whitacre; P. J. Rasmussen; E. P. Herrmann

[57] ABSTRACT

A variable gain control system for a digital signal is provided in which the digital signal addresses a digital memory to produce an output signal representative of the addressing signal modified by a transfer characteristic. A control word M is repetitively loaded into an M counter, which counts to a predetermined limit to produce output pulses when the limit is reached. The output pulses increment a data counter. Concurrently, an N control word is repetitively loaded into an N counter, which also counts to a predetermined limit to produce output pulses when that limit is reached. The output pulses of the N counter increment an address counter. When the count of the address counter changes, the current value of the data counter is loaded into a digital memory at the address provided by the address counter. The memory is loaded in this manner to store a data array representative of a signal gain related to the ratio of the N to M.

14 Claims, 11 Drawing Figures

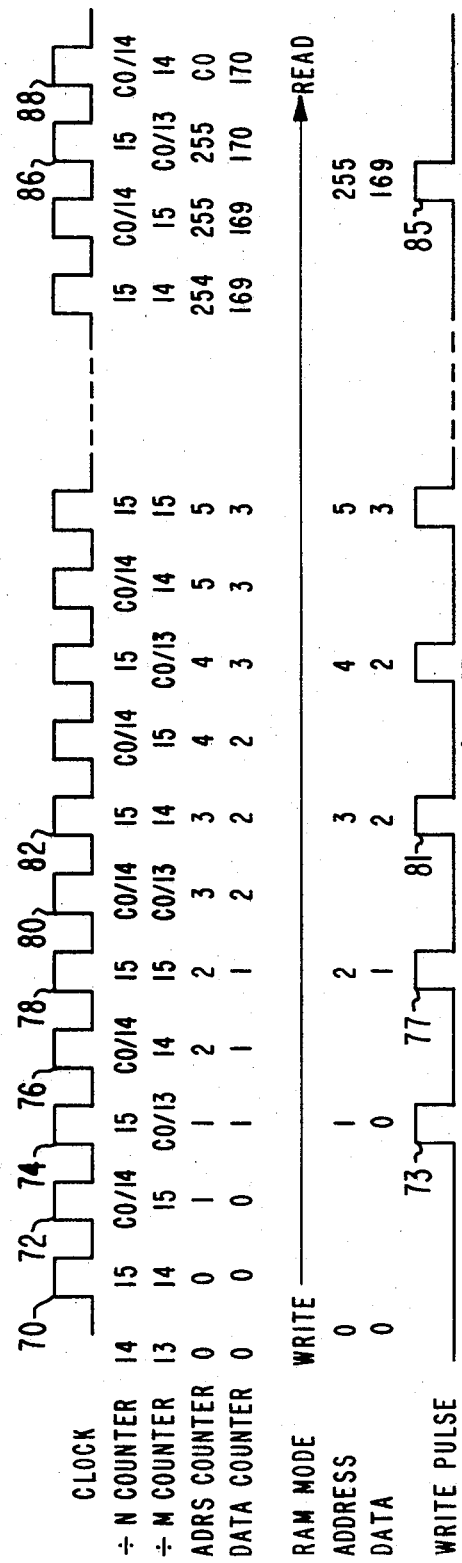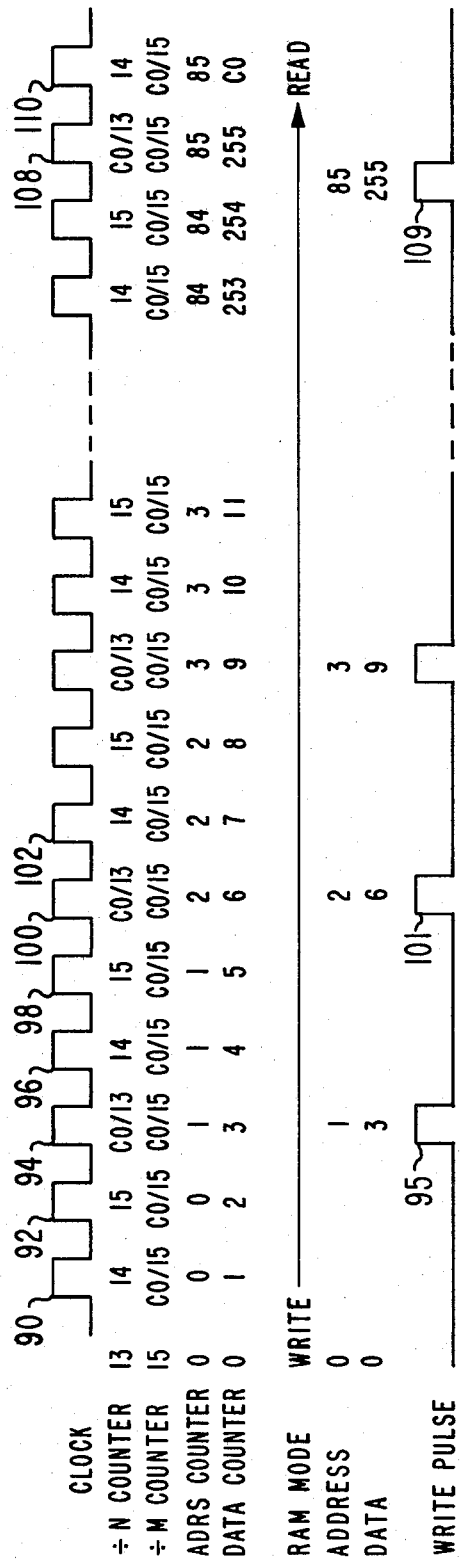

DIGITAL GAIN CONTROL SYSTEM

This invention relates to gain control of digital signals and, in particular, to a variable gain control system for a digital signal which uses a digital memory.

In systems which process digital signals, such as television receivers in which the baseband video signal is processed digitally, it is frequently desirable to amplify or attenuate the digital signal in response to a variable viewer control. For instance, the chrominance signal in a television receiver may be amplified or attenuated in response to the setting of a color control to allow the viewer to adjust the color saturation. Similarly, the luminance signal may be amplified or attenuated in response to a viewer control to change the picture contrast.

One technique for amplifying or attenuating a digital signal is to apply the digital signal to the address input of a digital memory. The digital memory is programmed with a data array in which each address location contains a value representing an input signal value multiplied by a gain factor. The output of the memory thus is equal to the digital input signal mutliplied by this gain factor.

If the gain factor is to be fixed for all operating conditions, a read-only memory (ROM) may be used for the digital memory in the above example. If it is desired to be able to vary the gain of the system, an alterable digital memory, such as a random access memory (RAM) may be used, as described in the U.S. Pat. No. 4,396,938 filed by Robert A. Dischert on July 23, 1981 and entitled "CONTROLLED RAM SIGNAL PROCESOR". In the arrangement shown in this patent application, a control signal representative of the desired gain of the system is applied to a microprocessor, which is programmed to generate the desired data array for the RAM. A newly generated data array is loaded into the RAM whenever it is desired to change the gain of the system. The microprocessor is an integral part of the embodiments there shown, since it is the microprocessor which generates the data array for the RAM each time the gain of the system is to be changed. It is desirable, however, to be able to generate the data array for the RAM in a more simplified and economical manner which does not require a microprocessor.

In accordance with the principles of the present invention, a variable gain control system for a digital signal is provided which uses a digital memory to provide a desired transfer characteristic for an applied digital signal. The memory contains a data array which represents a digital signal, applied to its address inputs, as modified by the desired transfer characteristic. The data array is a function of a variable control signal representing the numerical ratio N/M. Digital pulse trains are produced at rates which are representative of the ratio of N to M. One of the digital pulse trains is used to increment an address counter, and the other digital pulse train is used to increment a data counter. When the address counter is incremented to a new address value, that address is applied to the address input of the digital memory. The current value of the data counter is then loaded into the digital memory at the location addressed by the address counter. The memory is loaded in this manner over the dynamic range of the input signal of the system. The data array stored in the memory thus represents an input signal multiplied by a gain factor related to the N/M ratio.

In a preferred embodiment of the present invention, that portion of the memory data array which corresponds to input signals beyond the expected dynamic range of the input signal contains overrange data values which minimize the effects of noise and overrange input signals in the reproduced output signal.

In the drawings:

FIG. 3 is a table depicting the operation of the arrangements of FIGS. 1 and 2 when the input signal is to be attenuated;

FIG. 4 is a table depicting the operation of the arrangement of FIG. 1 when the input signal is to be amplfied;

Figure 1:
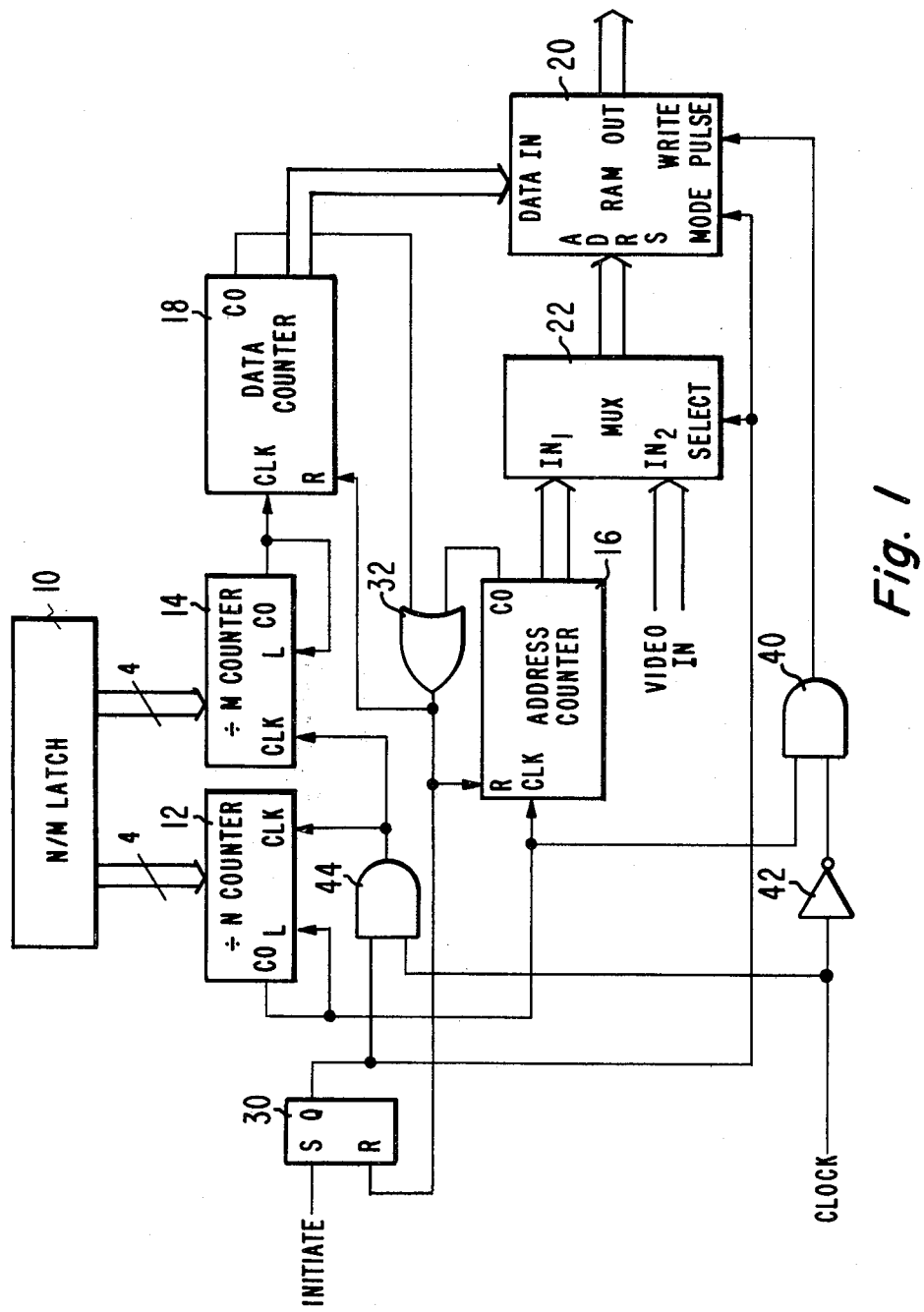
FIG. 1 illustrates, in block diagram form, a RAM based digital gain control system constructed in accordance with the principles of the present invention.

Referring to FIG. 1, a digital gain control system is shown, constructed in accordance with the principles of the present invention. Digital gain control words N and M are stored in an N/M latch or register 10. In this example, words N and M are each four bits in length. The stored N and M words are applied to the parallel inputs of a divide-by-N counter 12 and a divide-by-M counter 14, respectively. Each counter has an overflow, or carry-out signal output CO, a parallel load signal input L, and a clock input CLK. The CO output of counter 12 is coupled to the L input of the counter 12, and to a clock input CLK of an address counter 16. The CO output of counter 14 is coupled to the L input of the counter 14, and to a clock input CLK of a data counter 18.

Parallel outputs of the address counter 16 are coupled to one input $IN_1$ of a multiplexer 22. A video input signal is applied to a second input $IN_2$ of the multiplexer 22. The output of the multiplexer 22 is coupled to the address input of a RAM 20. Parallel outputs of the data counter 18 are coupled to the data input of the RAM 20. Carry-out signal outputs CO of the address and data counters are coupled to respective inputs of an OR gate 32, which has an output coupled to reset inputs R of counters 16 and 18, and to the reset input R of an R-S flip-flop 30.

An INITIATE signal is applied to the set input S of flip-flop 30. The Q output of flip-flop 30 is coupled to the SELECT input of multiplexer 22, the MODE input of the RAM 20, and to one input of an AND gate 44. The output of AND gate 44 is coupled to the CLK inputs of counters 12 and 14. A clock signal is applied to a second input of AND gate 44, and to the input of an inverter 42. The output of inverter 42 is coupled to one input of an AND gate 40, the other input of which is coupled to the CO output of divide-by-N counter 12. The output of AND gate 40 is coupled to the WRITE PULSE input of the RAM 20.

The RAM 20 has two modes of operation: read and write. In the read mode, the RAM is amplifying or attenuating an applied digital video signal. In the write mode, the data array of the RAM is changed to subsequently amplify or attenuate the applied digital video signal by a different gain factor. In the read mode, flip-flop 30 is reset, and its Q output provides a low output signal. This low signal selects input $IN_2$ of the multiplexer 22, which then couples the digital video input signal at input $IN_2$ through to the output of the multiplexer. The low Q signal also sets the RAM in its read mode, so that the digital video signal at its address input selects memory locations which are read out at the output of the RAM 20. The digital video signal is thereby attenuated or amplified by the gain factor represented by the data array stored in the RAM 20.

When it is desired to change the gain factor of the RAM 20, new values of N and M are entered or loaded into the N/M latch 10. The new values of N and M are applied to the inputs of the divide-by-N counter 12 and the divide-by-M counter 14, respectively, and are loaded into these counters. An INITIATE signal is then applied to flip-flop 30, which sets the flip-flop, causing the Q signal to go high. The high Q signal selects input $IN_1$ of the multiplexer 22, so that the output of the address counter 16 is coupled through to the address input of the RAM 20. The high Q signal also sets the RAM 20 to its write mode, and enables one input of AND gate 44. The divide-by-N and M counters are now loaded with the N and M values, with the address and data counters having been previously reset to zero in the manner described above.

The AND gate 44 is now enabled, so that it passes clock signals to the CLK inputs of counters 12 and 14. The divide-by-N counter 12 begins to count up from its initial value of N, and the divide-by-M counter begins to count up from its initial value of M. When the counters N and M are four-bit counters, the M counter will eventually increment from its maximum count of 1111 to an overflow condition, at which time a carry-out pulse is produced at its CO output. The carry-out pulse causes the data counter 18 to be incremented by one, and also causes the M value to be loaded into the divide-by-M counter 14. The cycle is then repeated, with the data counter 18 being incremented each time the divide-by-M counter 14 overflows.

The divide-by-N counter 12 operates in a similar manner, counting up from its initial value of N and overflowing on the clock cycle following its maximum count of 1111. When counter 12 overflows, the address counter 16 is incremented by one. The overflow signal of divide-by-N counter 12 lasts for a full clock cycle. During the second half of the overflow signal, the inverted clock signal provided by inverter 42 is high, and the two inputs of AND gate 40 are enabled. The AND gate 40 produces a pulse at this time, which stores the value of the data counter 18 in the RAM 20 at the RAM location determined by the value of the address counter 16.

The RAM 20 is continuously loaded in this manner, with the value of the data counter 18 loaded into consecutive RAM locations each clock cycle that the address counter 16 is incremented. With the address counter 16 having an output word the same length as that of the RAM address word, successive RAM locations will be loaded until either the data counter or the address counter overflows. For instance, if the address word of the RAM is eight bits in length, the address counter 16 is chosen to be an eight-bit counter. If the data counter 18 is not being incremented at a rate greater than that of the address counter 16, the address counter 16 will eventually reach its maximum count (and the last RAM address) of 11111111 before the data counter 18 overflows. The RAM 20 will then be fully loaded, and the next pulse at the CLK input of the address counter 16 will cause the counter 16 to overflow, producing a pulse at the carry-out output CO of the counter. This pulse is passed by OR gate 32 to reset both the address and data counters to zero, and will reset flip-flop 30. The Q signal of the flip-flop 30 will now go low, which disables the clock gate 44, sets the RAM to its read mode, and again selects $IN_2$ of the multiplexer 22 to resume processing of the digital video signal by RAM 20 with a new data array.

It may also be seen that, if the data counter 18 overflows before the address counter 16, the carry-out pulse of the data counter 18 will similarly reset both the address and data counters and the flip-flop 30.

In the embodiment of FIG. 1, the divide-by-N and M counters 12 and 14 count up from the N and M values. The gain of the RAM is then calculated as $(N_{OF}-N)/(M_{OF}-M)$, where $N_{OF}$ and $M_{OF}$ are the counts at which the respective counters overflow. When counters 12 and 14 are four-bit counters, $M_{OF}$ and $N_{OF}$ are both equal to 16. Thus, for instance, when the RAM 20 is to provide a gain of two-thirds, $(N_{OF}-N)/(M_{OF}-M)$ is equal to $\frac{2}{3}$. With $N_{OF}$ and $M_{OF}$ equal to 16, values of 14 for N and 13 for M will satisfy the equality. An example of the operation of the arrangement of FIG. 1 for N=14 and M=13 is shown in the table of FIG. 3.

Initially, the divide-by-N counter 12 is loaded with a value of 14, and the divide-by-M counter 14 is loaded with a value of 13, as shown at the left side of FIG. 3. The address and data counters are both reset to zero, and the RAM is placed in its write mode. At the time of the first clock pulse 70, the divide-by-N counter is incremented to 15 and the divide-by-M counter is incremented to 14. The next clock pulse 72 increments the divide-by-N counter to produce a carry-out pulse, which increments the address counter to 1. Clock pulse 72 also increments the divide-by-M counter to 15. The divide-by-N counter is reloaded to a value of 14 and the second half of the clock cycle produces a write pulse 73. The value of the data counter, zero, is now written into the RAM at address location 1.

The next clock pulse 74 increments the divide-by-N counter to 15 and increments the divide-by-M counter to produce a carry-out pulse. This carry-out pulse increments the data counter to 1 and reloads the divide-by-M counter with a value of 13. The next clock pulse 76 increments the divide-by-M counter to 14, and increments the divide-by-N counter to produce a carry-out pulse. This carry-out pulse increments the address counter to 2, and reloads a value of 14 into the divide-by-N counter. During the second half of this clock cycle, a write pulse 77 is produced, which loads a value of 1 from the data counter into the RAM at address location 2.

Two clock cycles later, clock pulse 80 causes both divide-by counters to overflow, incrementing the address counter to 3 and the data counter to 2. The following write pulse 81 writes a value of 2 into RAM address location 3.

The RAM is continuously loaded in this manner. It is seen that the address counter is incremented every two clock cycles, and the data counter is incremented every three clock cycles. The address and data counters are thus incremented by pulse trains having rates which are representative of the N/M gain ratio, in this example, two-thirds.

Finally, a data value of 169 is loaded into the last RAM address location 255 by write pulse 85. Two clock pulses later, clock pulse 88 causes the divide-by-N counter to produce a carry-out pulse. This carry-out pulse increments the address counter so that it in turn produces a carry-out pulse. This latter carry-out pulse resets both the address and data counters and resets flip-flop 30 in FIG. 1, causing the system to revert to the read mode.

Figure 5:
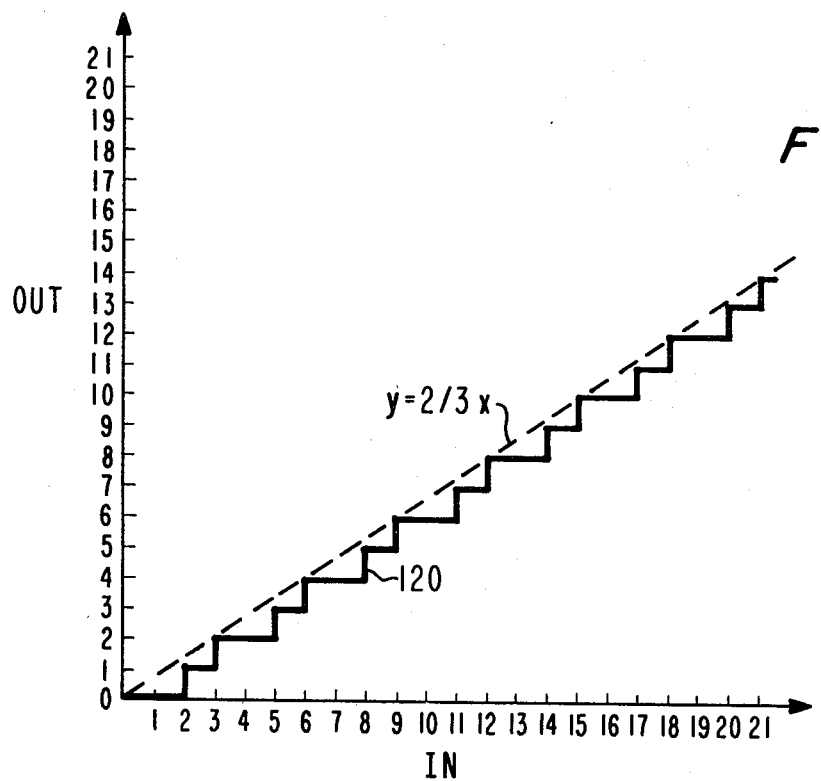
FIGS. 5 and 6 represent graphically the results shown in the tables of FIGS. 3 and 4, respectively.

The address and data values of FIG. 3 are represented graphically in FIG. 5 by the step waveform 120. The dashed line drawn along waveform 120 represents the slope of the step waveform, and is seen to produce an output signal, y, equal to ⅔ of x, the input signal, where the input signal is indicated by the abscissa values and the output signal is indicated by the ordinate values in the FIGURE. The gain is seen to be two-thirds.

FIG. 4 is similar to FIG. 3, and represents the operation of the embodiment of FIG. 1 for a gain greater than one, during which the data counter is incremented at a greater rate than the address counter. The four-bit divide-by-N counter starts counting from an initial value of 13, and the four-bit divide-by-M counter starts from a count of 15. Inserting these values into the expression $(N_{OF}-N)/(M_{OF}-M)$ yields (16-13)/(16-15), or 3/1=3.

Starting from the initial values of 13 and 15, the divide-by-N counter is incremented to 14 and the divide-by-M counter is incremented to produce a carry-out pulse by the first clock pulse 90. This carry-out pulse increments the data counter to 1, and reloads the divide-by-M counter with the value 15. The next clock pulse 92 increments the divide-by-N counter to 15 and causes the divide-by-M counter to produce a carry-out pulse, which increments the data counter to 2 and reloads the divide-by-M counter with a value of 15. The third clock pulse 94 causes both divide-by counters to produce carry-out pulses, which increment the data counter to 3 and the address counter to 1. The next half clock cycle produces a write pulse 95, which loads a value of 3 into RAM address location 1. The divide-by counters are reloaded to their initial values, and the counting cycle continues. Three clock cycles later, the address counter is incremented to 2 as the data counter is increment to 6. Write pulse 101 then writes a value of 6 into RAM address location 2. Finally, at a clock pulse 108, the address and data counters are incremented to values of 85 and 255, respectively. A write pulse 109 loads a value of 255 into RAM address location 85. At the next clock pulse 110, the divide-by-M counter produces a carry-out pulse, which in turn increments the data counter so that it produces a carry-out pulse. The pulse from the data counter resets both the address and data counters and the flip-flop 30, returning the system of FIG. 1 to the read mode.

Figure 6:
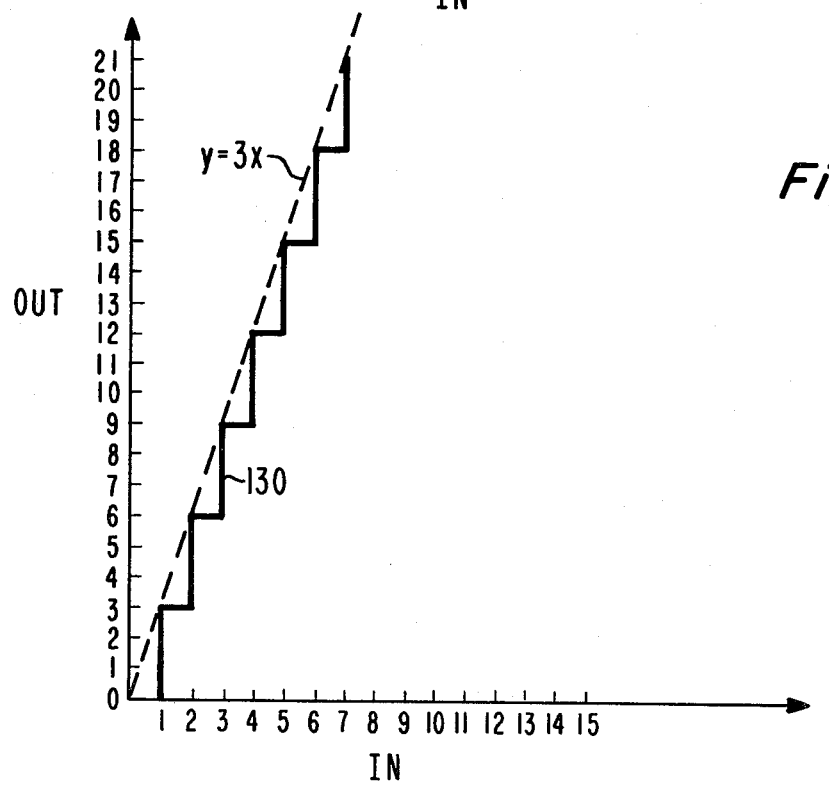

The RAM address and data values of FIG. 4 are shown graphically by the step waveform 130 of FIG. 6. This step waveform approximates the straight line transfer function y=3x where y is the output signal and x is the input signal in FIG. 6. The gain is seen to be three.

Figure 2:
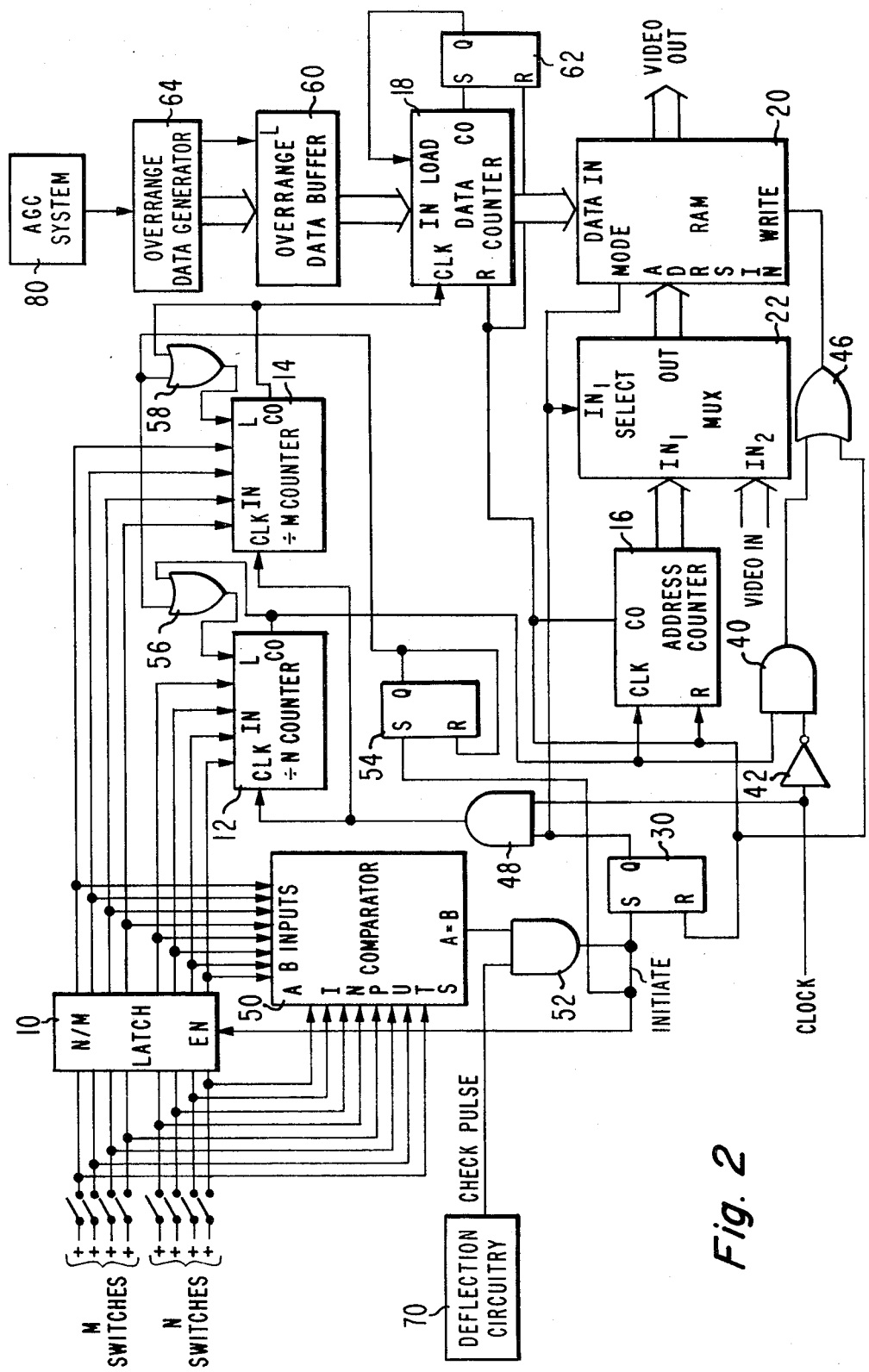
FIG. 2 illustrates, in block diagram form, a RAM based digital gain control system constructed in accordance with the principles of the present invention to provide predetermined overrange output signals for input signals beyond their expected dynamic range.

A second embodiment of a digital gain control system, constructed in accordance with the principles of the present invention for a television receiver, is shown in FIG. 2. Elements of FIG. 2 which were described in FIG. 1 bear the same reference numerals and their description will be omitted.

In FIG. 2, eight switches are provided for applying the four-bit M and N signals to the N/M latch 10. In a television receiver, the N and M switches may be contained, for instance, within a stacked wafer switch activated by a common shaft to cause the switch contacts to open and close in predetermined sequences as the shaft is turned. Signals provided by the N and M switches are applied to the "A" inputs of an A versus B comparator 50. The outputs of the N/M latch 10 are coupled to the "B" inputs of the comparator 50. As in FIG. 1, the N and M outputs of the latch 10 are coupled to the inputs of divide-by-N counter 12 and divide-by-M counter 14, respectively.

The A=B output of comparator 50 is coupled to one input of an AND gate 52. A gate pulse signal developed by television deflection circuitry 70 is applied to a second input of AND gate 52. The output of AND gate 52 is coupled to the enable input of latch 10, and to the set inputs S of two R-S flip-flops 30 and 54. The Q output of R-S flip-flop 54 is coupled to the reset input R of flip-flop 54, and to inputs of OR gates 56 and 58. The carry-out output CO of divide-by-N counter 12 is coupled to a second input of OR gate 56, to the CLK input of address counter 16, and to one input of AND gate 40. The output of OR gate 56 is coupled to the load input L of divide-by-N counter 12. The carry-out output CO of divide-by-M counter 14 is coupled to the CLK input of the data counter 18, and to a second input of OR gate 58. The output of OR gate 58 is coupled to the load input L of divide-by-M counter 14.

The Q output of R-S flip-flop 30 is coupled to one input of an AND gate 48, to the IN₁ select input of the multiplexer 22, and to the mode select input of the RAM 20. The output of AND gate 48 is coupled to the CLK inputs of the counters 12 and 14. A clock signal is applied to a second input of AND gate 48, and to the input of inverter 42.

The carry-out output CO of the data counter 18 is coupled to the S input of an R-S flip-flop 62. The Q output of flip-flop 62 is coupled to the load input of the data counter 18. The output of AND gate 40 is coupled to one input of an OR gate 46. The output of inverter 42 is coupled to a second input of AND gate 40. The CO output of the address counter 16 is coupled to the reset inputs R of the data counter 18, the flip-flop 62, the address counter 16, and the flip-flop 30. The output of the OR gate 46 is coupled to the write pulse input of the RAM 20.

An overrange data buffer 60 is coupled to parallel inputs of the data counter 18. An AGC system 80 has an output coupled to the input of an overrange data generator 64, the latter having outputs coupled to inputs of the buffer 60.

When the system of FIG. 2 is processing the video signal applied to input IN₂ of the multiplexer 22, flip-flop 30 is reset and its Q output produces a low signal. This low signal selects input IN₂ of the multiplexer to apply the video signal to the address input of the RAM 20, and also sets the RAM to its read mode of operation.

The gain of the system is changed by opening and closing various ones of the M and N switches. In order to prevent interruption of the processing of the video signal, it is desirable to load the RAM 20 during an inactive period of the video signal, such as the vertical blanking interval. Accordingly, the check pulse, which initiates a gain change, is produced at the beginning of the vertical blanking interval by the television deflection circuitry 70. If the M and N switches have not been changed, the signals at the "A" inputs of the comparator 50 will be the same as the signals held by the N/M latch 10, which are applied to the "B" inputs of the comparator. A will then equal B, and the signal at the A=B output of the comparator 50 will be low. Thus, when the check pulse is applied to one input of AND gate 52, the low A=B signal at the other gate input will inhibit the gate, and operation of the RAM 20 in the read mode will continue uninterrupted.

When one or more of the M and N switches are adjusted to change the gain of the system, the signals at the "A" inputs of the comparator will differ from those at the "B" inputs. A will no longer equal B, and the A=B signal will go high. When the next check pulse arrives, AND gate 52 will produce an INITIATE pulse, which latches the new M and N switch values into the N/M latch, and sets flip-flops 30 and 54 to initiate a gain change. The function of flip-flop 54 is to initialize the divide-by-M and N counters 12 and 14. When flip-flop 54 sets, its Q output goes high, producing a pulse which is coupled to the load inputs L of the counters 12 and 14 by way of OR gates 56 and 58. This load pulse loads the new values of N and M into the divide-by-N and M counters. The Q output of flip-flop 54 is coupled to the reset input of the flip-flop, so that the flip-flop will immediately proceed to reset itself.

When flip-flop 30 sets, its Q output signal selects input $IN_1$ of the multiplexer, which couples the output of the address counter 16 to the address input of the RAM 20. The Q output signal of flip-flop 30 also sets the RAM 20 to its write mode of operation, and enables AND gate 48. The AND gate 48 now passes clock signals to the divide-by-N and M counters 12 and 14, which operate as described in FIG. 1. Carry-out signals from the divide-by-M counter 14 increment the data counter 18 and reload the M value into the counter 14. Carry-out signals from the divide-by-N counter 12 increment the address counter 16, reload N into counter 12, and enable the passage of clock pulses to the write pulse input of RAM 20 during the second half of each clock cycle. If the gain of the system is to be less than or equal to one, the address counter 16 will reach the maximum RAM address value before the data counter 18 has overflowed. At that time, every RAM address location will have been loaded with a data value, and the next carry-out pulse from divide-by-N counter 12 will cause the address counter 16 to overflow, producing a carry-out pulse at its CO output. This carry-out pulse resets the data and address counters, and is also passed by way of OR gate 46 to the write pulse input of the RAM 20. This write pulse now loads the reset data counter value of zero into address location zero of the RAM 20. The carry-out pulse also resets flip-flop 30, causing its Q output signal to go low. The low Q output signal selects input $IN_2$ of the multiplexer 22 and returns the RAM 20 to its read mode for processing of the video signal with the new gain factor.

If the new gain factor is greater than one, the data counter 18 will overflow before the address counter 16 has reached the highest RAM address. Since data values in the remaining address locations correspond to signal levels beyond the expected dynamic range of the input video signal being processed, overrange data values are loaded into the remaining RAM address locations. This is accomplished in response to the carry-out signal produced at the CO output of the data counter 18. This signal sets flip-flop 62, causing the Q output of the flip-flop 62 to load an overrange data value from buffer 60 into the data counter 18. With a high signal applied to the load input of the data counter 18, carry-out pulses at the CLK input of the counter will have no effect on the counter. This prevents the data counter 18 from being incremented, and insures that it will continue to hold the overrange data value. The address counter will continue to be incremented by carry-out pulses of the divide-by-N counter 12. During the second half of each clock cycle, AND gate 40 produces a clock pulse for the write pulse input of RAM 20 by way of OR gate 46. This causes the overrange data value held by the data counter 18 to be loaded into the remaining RAM address locations as the address counter is incremented through the remaining RAM addresses. After the last RAM address location has been loaded, the carry-out pulse from the address counter 16 resets flip-flop 62 and the address and data counters. The carry-out pulse also loads a value of zero into address location zero of the RAM 20, and resets flip-flop 30, returning the system to the read mode of operation for processing of the video signal.

The performance of the gain control system of FIG. 2 may be appreciated by considering the transfer characteristics of FIG. 7. FIG. 7A represents the transfer characteristic 142 of the RAM 20 when loaded with data to provide a gain of one. In this condition, each RAM address location contains a data value equal to the address. The highest RAM address location n contains a data value m, which is equal to n.

Figure 7A:
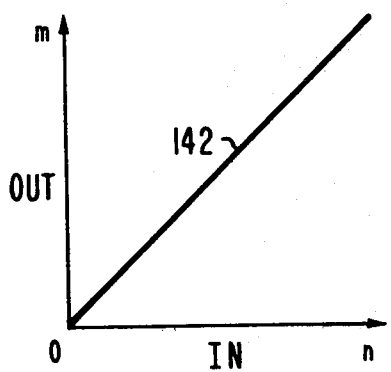
FIGS. 7a–7d illustrate typical transfer characteristics of the gain control system of FIG. 2.
Figure 7B:
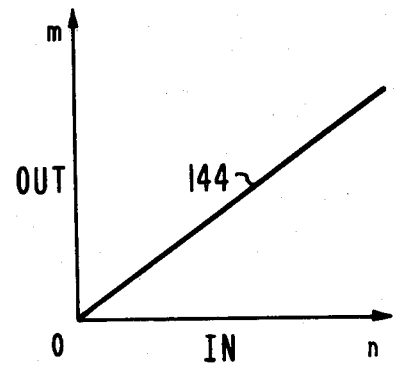

FIG. 7B represents the transfer characteristic 144 of the RAM for a condition of a gain less than one. In this condition, the highest RAM address location n contains a data value less than the maximum permissible data value of m.

Figure 7C:
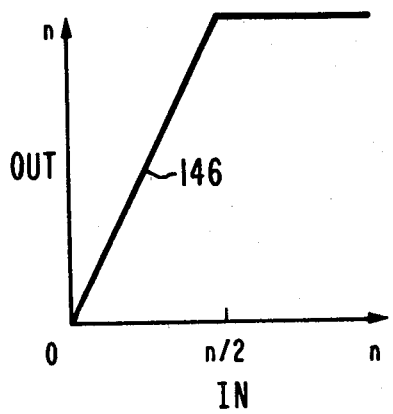

FIG. 7C represents the transfer characteristic 146 of the RAM for the condition of a gain of two. In this condition, an n by n capacity RAM will be loaded with the maximum data value of n when the address has reached a value of n/2. Thereafter, higher address values are beyond the expected dynamic range of the input signal; since the gain is set for two, it is expected that the input signal will not exceed a value of n/2. In FIG. 7C, address locations above n/2 are loaded with an overrange data value of n, giving the gain control system a saturating amplifier characteristic. Input signals above the expected maximum value of n/2 produce output signals clamped to the extreme of the dynamic range of the system. This would effectively clip the peaks of an overrange input signal.

Figure 7D:
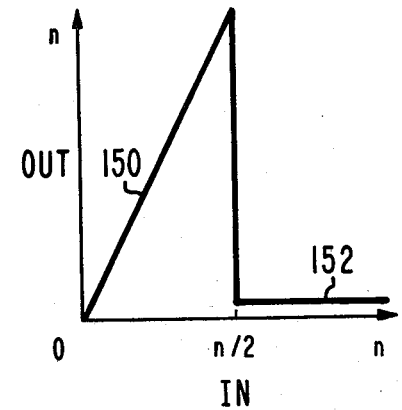

In a particular system, it may be possible to control the level of the input signal to the gain control system so that valid signals will never exceed their expected dynamic range. Signal levels beyond the dynamic range may be treated as erroneous signals caused, for instance, by impulse noise. Therefore, it may be desirable to sharply attenuate signals beyond the expected dynamic range of the input signal to eliminate such impulse disturbances. FIG. 7D represents the transfer characteristic of the RAM for the condition of a gain of two, as shown by line 150, which reaches a maximum data value of n for an address value of n/2. Since input signals above a value of n/2 are to be treated as erroneous and are to be eliminated, the overrange data value loaded into the remaining RAM address locations are at a very low level, as represented by line 152. Thus, impulse noise beyond the expected dynamic range of the input signal will produce only a low level output signal, or may be eliminated entirely.

Figure 8:
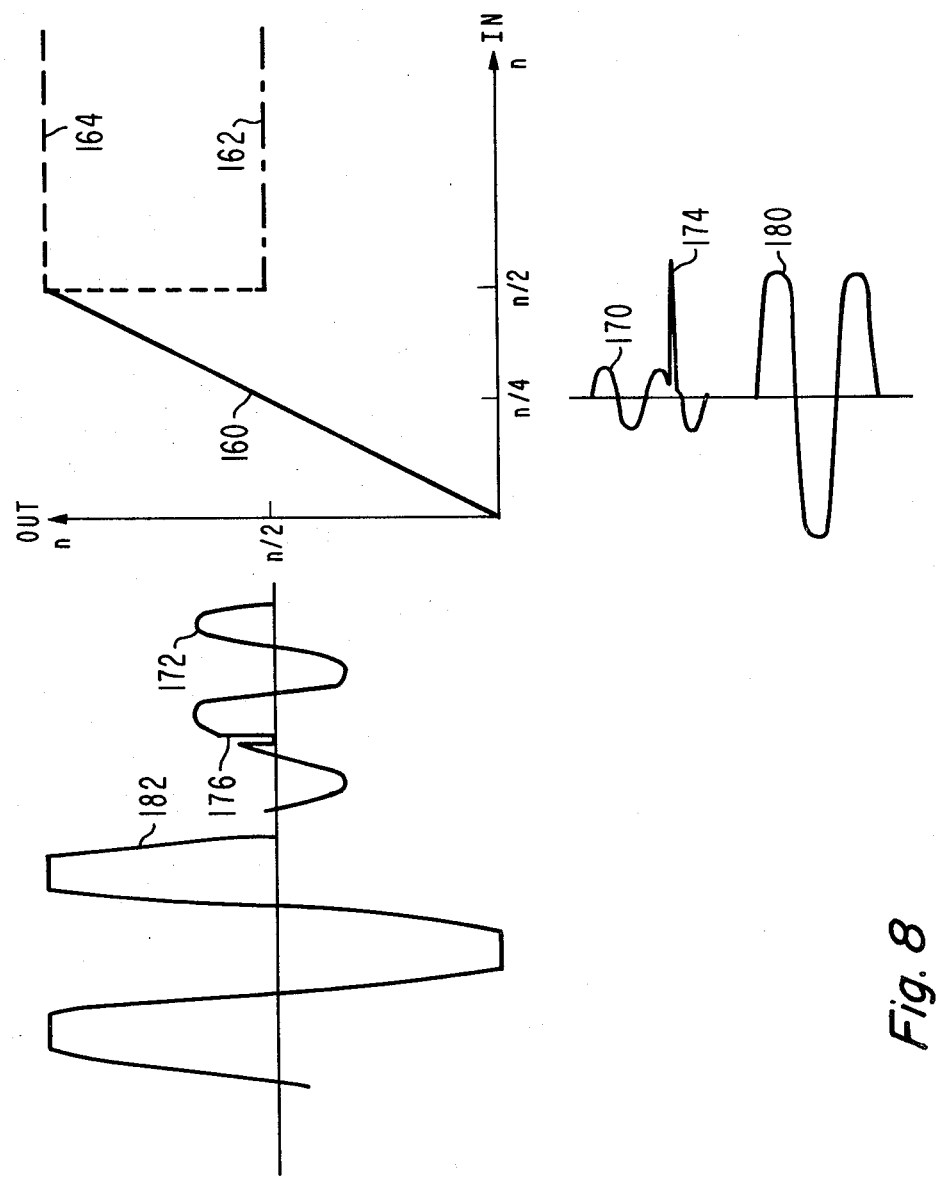
FIG. 8 illustrates a transfer characteristic of an adaptive gain control system constructed in accordance with a further aspect of the present invention.

The gain control system of FIG. 2 may also be operated adaptively as a function of input signal level. For instance, two common signal conditions in a television receiver are weak, noisy signals and strong, relatively noise-free signals. The gain control system of FIG. 2 may be operated to provide the most desirable transfer characteristic for each of these signal conditions. For example, when the television receiver's automatic gain control system 80 senses the reception of relatively weak signals, it produces a control signal causing the overrange data generator 64 to develop a signal corresponding to a median signal level. The overrange data buffer 60 is then loaded with a level corresponding to the median signal level. If the median input signal level is n/4, the median output signal level stored in the buffer 60 is n/2 for a gain of two. The transfer characteristic of the RAM is then illustrated by lines 160 and 162 of FIG. 8, with the overrange data value set at n/2. Input signal 170 will then be reproduced as shown by output signal 172. When a noise pulse 174 occurs in input signal 170, the output signal level is reproduced at the n/2 level, thereby clamping impulse noise to the median signal level as indicated at 176 of the output signal 172.

But when the television automatic gain control system 80 senses the reception of strong input signals, the overrange data buffer is loaded with the maximum signal value n developed by the generator 64 in response to the AGC control signal. The RAM 20 is then loaded to exhibit a transfer characteristic shown by lines 160 and 164 for a gain of two with the line 164 representing the maximum signal value n. If a strong input signal 180 exceeds the dynamic range of the system, the signal peaks are clipped as shown by output signal 182, producing only minor distortion of the processed signal. Of course, it may further be desirable to reduce the gain factor of the system when very strong input signals are received.

What is claimed is:

1. In a system for processing digital signals, a gain control arrangement comprising:

a source of first clock signals;

a source of second clock signals;

control means for controlling the relative rates of said first and second clock signals;

address counter means, responsive to said first clock signals, for generating digital address words;

data counter means, responsive to said second clock signals, for generating digital input data words;

a digital memory including an address input port, a data input port coupled to receive said digital input data words, and data output means for supplying data words stored in addressed memory locations; and means for selectively applying said address words to said address input port for conditioning said memory to load said digital input data words into said memory thereby programming the memory with a gain function or selectively applying said digital signals to said address input port and conditioning said memory to output stored data in response to said digital signals applied to the address input port and wherein said output data correspond respectively to said applied digital signals transformed by said gain function.

2. The arrangement of claim 1, wherein said source of first clock signals comprises an N counter having a data input and an output coupled to said address counter;

said source of second clock signals comprises an M counter having a data input and an output coupled to said data counter; and said control means comprises a source of N and M control words coupled to said data inputs of said N and M counters.

3. The arrangement of claims 1 or 2, wherein said digital memory includes means responsive to said first clock signals for entering said digital input data words into memory locations addressed by said digital address words.

4. The arrangement of claim 2, wherein said source of first clock signals includes N loading means, responsive to said first clock signals, for entering said N control word into said N counter; and said source of second clock signals includes M loading means, responsive to said second clock signals, for entering said M control word into said M counter.

5. In a digital signal processing system, a gain control arrangement comprising:

a digital memory including a plurality of memory locations addressable in response to the application of digital address words to an address input, data input means for receiving digital input data words to be entered in addressed memory locations during a write mode, and data output means for supplying data words stored in addressed memory locations during a read mode;

a source of first clock signals;

a source of second clock signals;

control means for controlling the relative rates of said first and second clock signals;

address counter means, responsive to said first clock signals, for generating said digital address words during said write mode;

data counter means, responsive to said second clock signals, for generating said digital input data words during said write mode; and mode control means, for conditioning said memory to enter said digital input data words into said digital memory at the memory locations addressed by said address words during said write mode wherein the correspondence between the memory address words and respective input data words entered into respective memory locations defines a gain function, and for conditioning said memory to output said data words responsive to said digital signal applied to said address input during said read mode, said output data words corresponding to said digital signals transformed by said gain function.

6. In a system for processing digital signals, a gain control system comprising:

a digital memory having an address input port, a data input port, and an output port, and operable in read and write modes;

a source of N control signals;

a source of M control signals;

an N counter, responsive to said N control signals, for counting to a predetermined limit relative to the value of said N control signal, and having an output for producing an address increment signal when said predetermined limit is reached;

an M counter, responsive to said M control signals, for counting to a predetermined limit relative to the value of said M control signal, and having an output for producing a data increment signal when said predetermined limit is reached;

a data counter, having an input responsive to said data increment signal for incrementing a stored data value to generate a data word, and an output coupled to said data input port of said digital memory;

an address counter, having an input responsive to said address increment signal for incrementing a stored address value to generate address words, and an output port coupled to said address input port of said memory; and means for selectively applying said address words to said address input port for conditioning said memory to load said digital input data words into said memory thereby programming the memory with a gain function or selectively applying said digital signals to said address input port and conditioning said memory to output stored data in response to said digital signals applied to the address input port and wherein said output data correspond respectively to said applied digital signals transformed by said gain function.

7. The arrangement of claim 6, wherein said N counter further includes a load signal input responsive to said address increment signal for loading said N control signal into said N counter; and wherein said M counter further includes a load signal input responsive to said data increment signal for loading said M control signal into said M counter.

8. The arrangement of claim 7, further comprising a source of clock signals, wherein said M and N counters are incremented by said clock signals when said memory is in said write mode.

9. The arrangement of claim 8, further comprising means, coupled to said address counter, and responsive to the value of said address counter, for resetting said address and data counters when said address counter has reached a predetermined value.

10. A method of programming the gain of a digital memory gain control system including a digital memory which produces output data corresponding to address signals multiplied by a gain factor, an address counter, and a data counter, comprising the steps of:
  a. generating a first clock signal having a first predetermined rate;
  b. generating a second clock signal having a second predetermined rate which is related to said first predetermined rate;
  c. incrementing said address counter in response to said first clock signal to generate an address value;
  d. incrementing said data counter in response to said second clock signal to generate a data value; and
  e. loading said data value into said digital memory at the memory location addressed by said address value.

11. A method of loading the digital memory of a digital gain control system, in which a digital input signal is applied to the address input of said digital memory to produce an output signal at the output of said digital memory corresponding to said input signal modified by a gain factor, comprising the steps of:
  a. generating a sequence of digital address values for said digital memory at a first rate;
  b. generating a sequence of digital data values for said digital memory at a second rate which is related to said first rate as a function of a desired gain factor; and
  c. loading selected ones of said digital data values into said digital memory in response to the generation of different ones of said digital address values.

12. A method of loading a random access memory for a digital gain control systm, in which a digital input signal having a known dynamic range addresses said random access memory to produce an output signal for each addressed memory location which represents an input signal value multiplied by a gain factor, comprising the steps of:
  a. loading a first plurality of memory locations having addresses corresponding to values of the digital input signal over its known dynamic range with data values equal to the respective address values multiplied by said gain factor; and
  b. loading remaining ones of the memory locations of said random access memory with values equal to overrange values desired to be produced when said digital input signal exceeds its known dynamic range.

13. In a system for processing input digital signals having a nominal range of digital signal levels, a digital signal gain control arrangement comprising:
  a digital memory for producing output data words corresponding to applied digital signals multiplied by a gain function including a plurality of memory locations addressable in response to the application of said input digital signals to an address input, data input means for receiving digital data words to be entered in addressed memory locations during a write mode, and data output means for supplying data words stored in addressed memory locations during a read mode;
  a source of in-range control signals representing the system signal gain function for input digital signals contained within said nominal range of digital signal levels;
  a source of overrange control signals representing the system gain function for input digital signals outside said nominal range of digital signal levels;
  means, responsive to said in-range control signals for entering digital data words corresponding to input digital signals translated by said gain function within said nominal range into a first plurality of said memory locations; and
  means, responsive to said overrange control signals, for entering digital data words corresponding to input digital signals translated by said gain function beyond said nominal range into a second plurality of said memory locations.

14. The arrangement of claim 13, wherein said source of overrange control signals comprises a television automatic gain control system.

* * * * *